US010555607B2

(12) United States Patent
Chen et al.

(10) Patent No.: US 10,555,607 B2
(45) Date of Patent: Feb. 11, 2020

(54) SLIDE RAIL ASSEMBLY

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chun-Yi Ho, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 0 days.

(21) Appl. No.: 16/153,802

(22) Filed: Oct. 7, 2018

(65) Prior Publication Data

US 2019/0274428 A1 Sep. 12, 2019

(30) Foreign Application Priority Data

Mar. 8, 2018 (TW) .............................. 107108197 A

(51) Int. Cl.
*A47B 88/49* (2017.01)
*A47B 88/403* (2017.01)
(Continued)

(52) U.S. Cl.
CPC ............ *A47B 88/49* (2017.01); *A47B 88/403* (2017.01); *A47B 88/477* (2017.01);
(Continued)

(58) Field of Classification Search
CPC ... A47B 88/473; A47B 88/443; A47B 88/447; A47B 88/57; A47B 88/44; A47B 88/49; A47B 88/423; A47B 88/407; A47B 88/493; A47B 2210/0018; A47B 2210/0016; A47B 2210/0059; A47B 2210/0081; A47B 2088/4235
(Continued)

(56) References Cited

U.S. PATENT DOCUMENTS 4,560,212 A * 12/1985 Papp .................... A47B 88/493
                                                              312/334.47
7,218,526 B2    5/2007  Mayer
(Continued)

FOREIGN PATENT DOCUMENTS

DE              41 06 809 A1    9/1992
DE      20 2012 101 928 U1      6/2012
(Continued)

*Primary Examiner* — Janet M Wilkens
(74) *Attorney, Agent, or Firm* — Winston Hsu

(57) ABSTRACT

A slide rail assembly includes a first rail, a second rail and a third rail. The third rail is mounted between the first rail and the second rail. The first rail includes a blocking structure. When the third rail is located at a retracted position with respect to the first rail, the blocking structure is used for preventing the third rail from being moved from the retracted position in a retracted direction. When the third rail is located at the retracted position, the second rail can be moved to a predetermined position in the retracted direction with a rear portion of the second rail being beyond a rear portion of the first rail by a distance.

18 Claims, 10 Drawing Sheets

(51) Int. Cl.
*A47B 88/477* (2017.01)
*H05K 7/14* (2006.01)

(52) U.S. Cl.
CPC .... *H05K 7/1489* (2013.01); *A47B 2210/0059* (2013.01); *A47B 2210/0081* (2013.01)

(58) Field of Classification Search
USPC ........ 312/333, 334.44–334.47, 334.1, 334.7, 312/334.8, 334.6
See application file for complete search history.

(56) References Cited

U.S. PATENT DOCUMENTS

| | | | | |
|---|---|---|---|---|
| 7,413,269 | B2 * | 8/2008 | Chen | A47B 88/493 312/333 |
| 8,083,298 | B2 | 12/2011 | Henderson | |
| 8,303,052 | B2 * | 11/2012 | Chen | A47B 88/493 312/319.1 |
| 8,403,436 | B2 * | 3/2013 | Yu | H05K 7/1489 312/333 |
| 8,672,431 | B2 * | 3/2014 | Chen | F24C 15/168 312/333 |
| 9,247,815 | B2 * | 2/2016 | Chen | A47B 88/49 |
| 9,498,060 | B1 * | 11/2016 | Hsu | A47B 88/467 |
| 2005/0162052 | A1 | 7/2005 | Chen | |
| 2009/0096340 | A1 * | 4/2009 | Chen | A47B 88/493 312/334.46 |
| 2011/0011817 | A1 | 1/2011 | Yamakawa | |
| 2018/0070723 | A1 * | 3/2018 | Chen | A47B 88/49 |
| 2018/0092462 | A1 * | 4/2018 | Chen | H05K 7/1489 |
| 2018/0317652 | A1 * | 11/2018 | Chen | A47B 88/423 |

FOREIGN PATENT DOCUMENTS

| | | | |
|---|---|---|---|
| EP | 3143901 | * | 3/2017 |
| EP | 3195760 | * | 7/2017 |
| EP | 3307038 | * | 4/2018 |
| EP | 3398481 | * | 11/2018 |

* cited by examiner

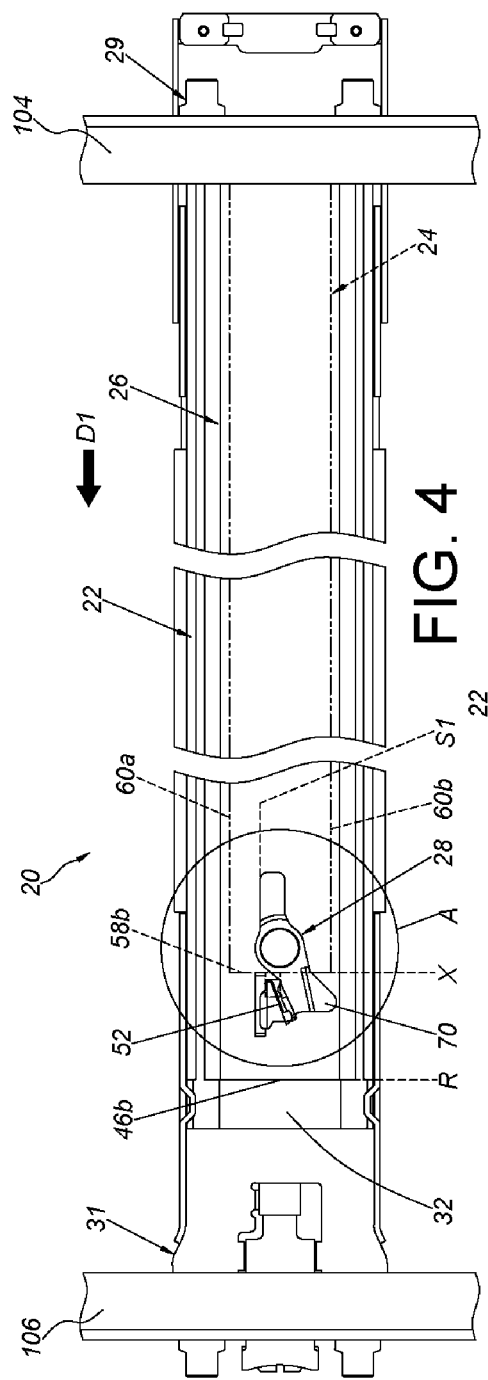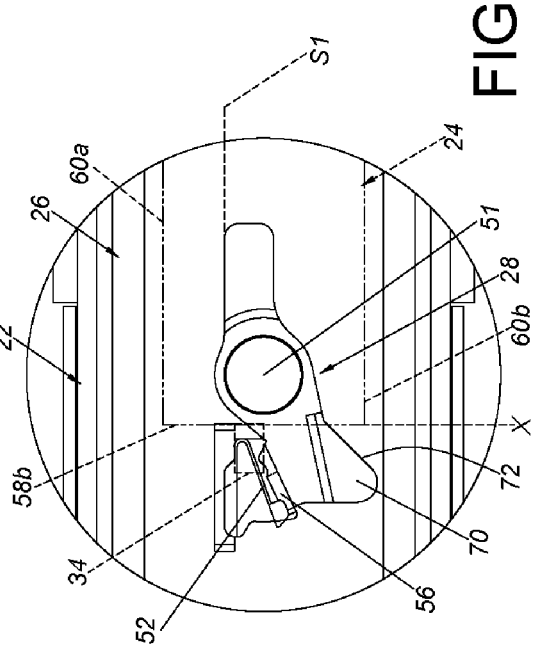

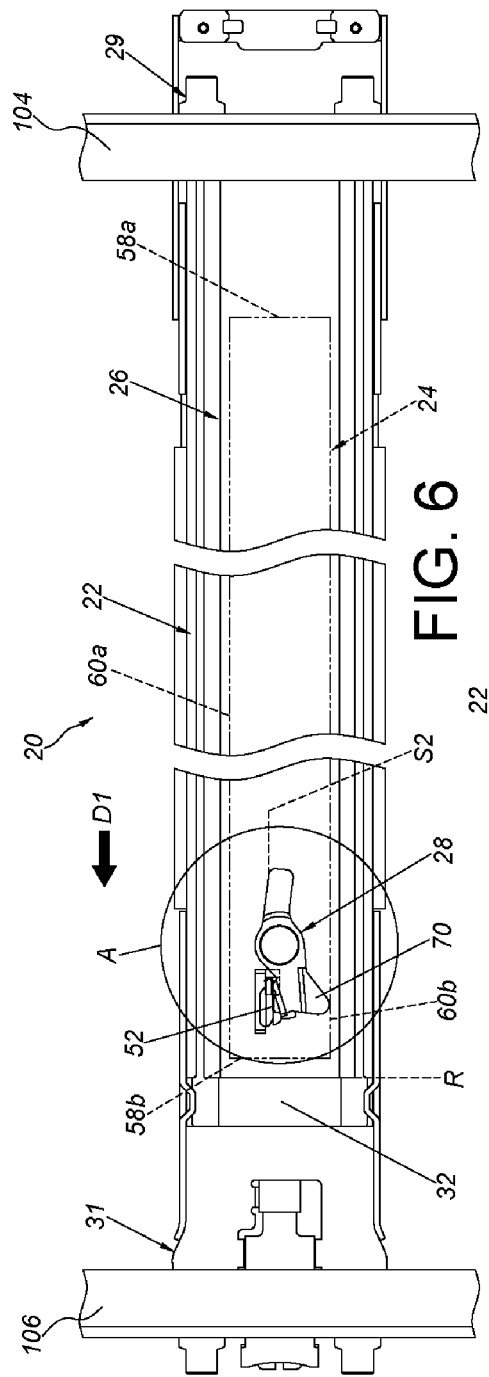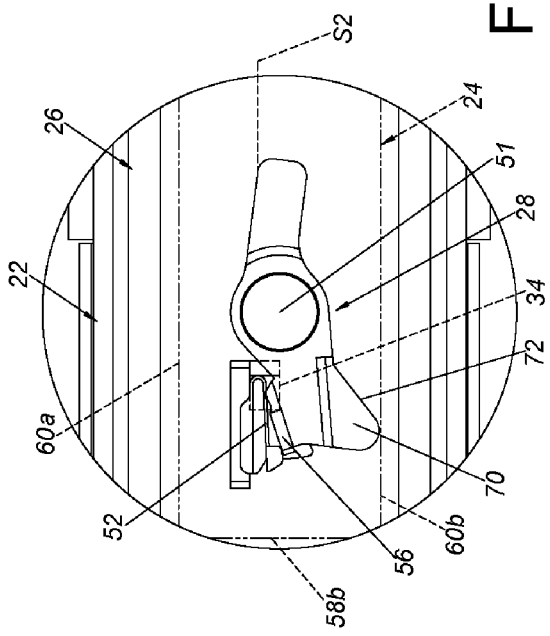

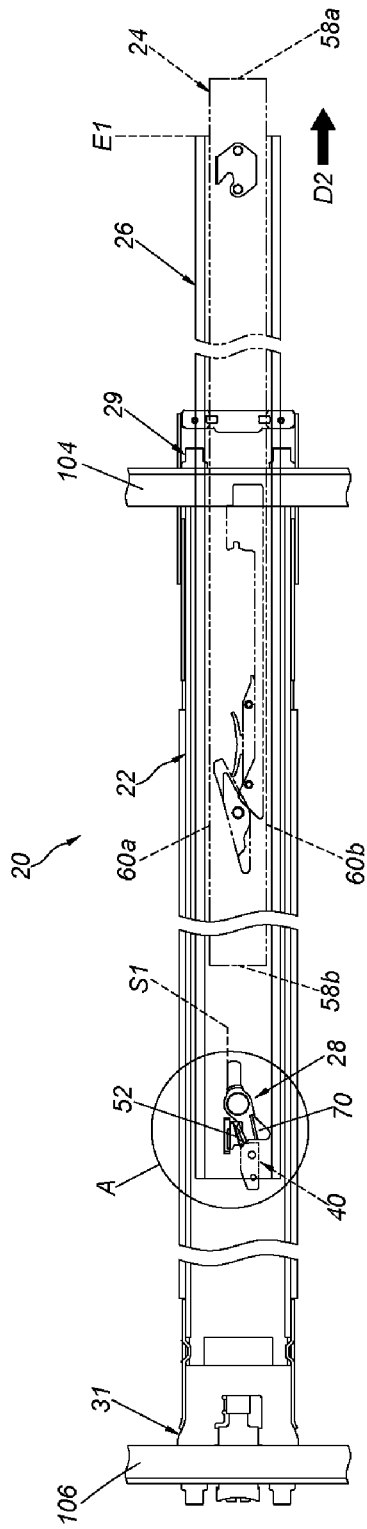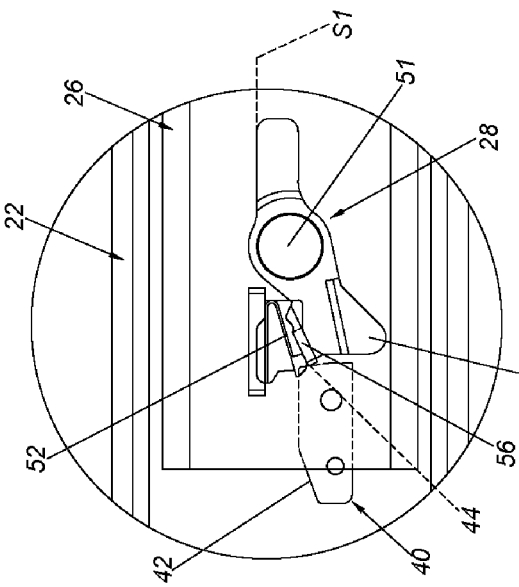

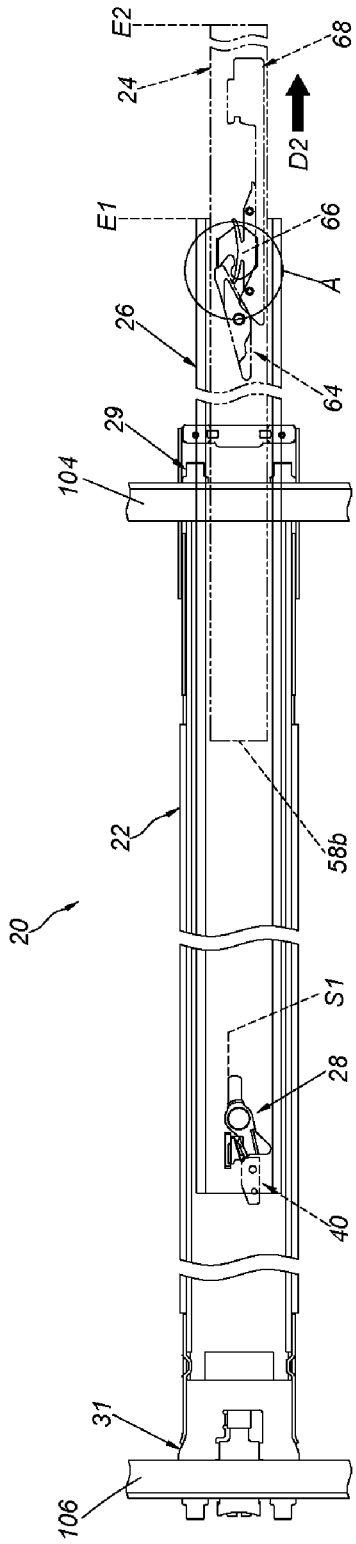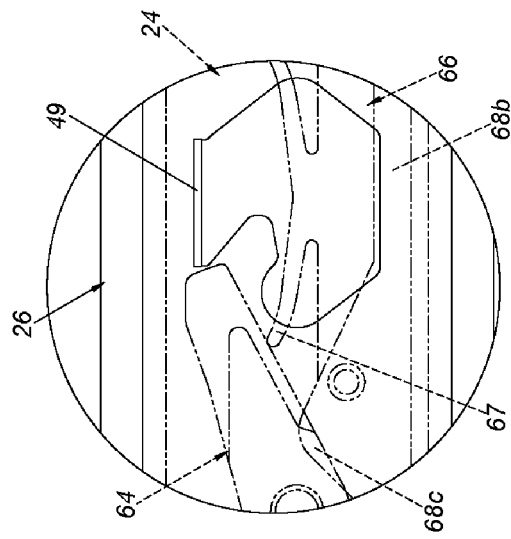

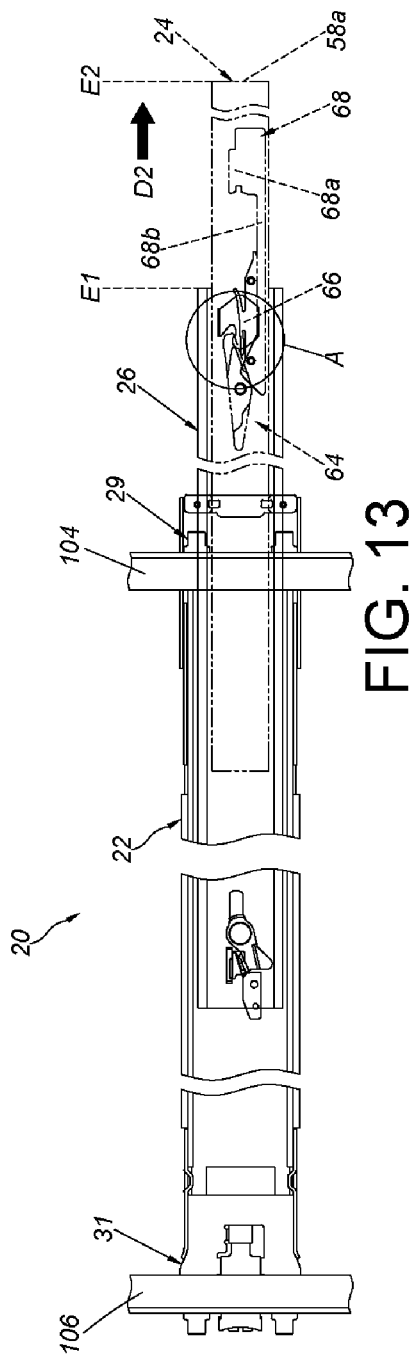
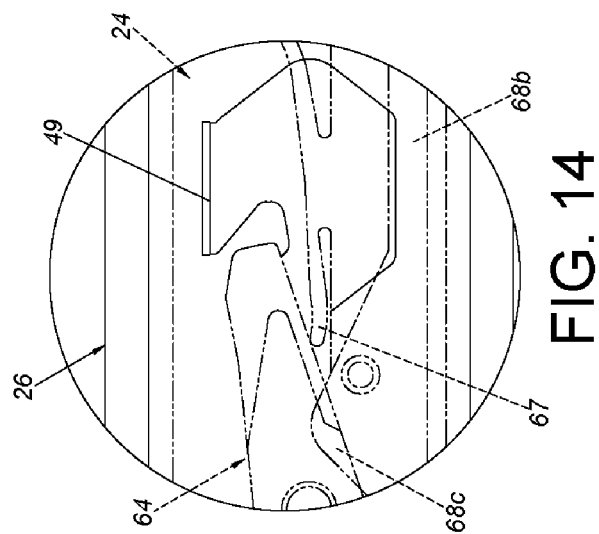
FIG. 13
FIG. 14

SLIDE RAIL ASSEMBLY

BACKGROUND OF THE INVENTION

1. Field of the Invention

The present invention relates to a slide rail assembly, and more particularly, to a slide rail assembly capable of facilitating maintenance for a carried object.

2. Description of the Prior Art

The drawings (e.g., FIG. 2) of U.S. Pat. No. 8,379,410 B2, invented by Kitten, discloses a plurality of carried objects (130, called chassis in the specification of the US patent). Both sides of each of the carried objects (130) are mounted to a rack (132) through support slides (134, 136), respectively. In use, each of the carried objects can only be moved out from the rack in a predetermined direction (e.g., the front side) to extend in front of the rack for facilitating repair or replacement parts or modules of the carried objects.

However, sometimes it is impossible to use the above-mentioned operation modes due to various requirements of maintenance of the slide rail assembly or the carried objects. Accordingly, how to develop a slide rail assembly for different maintenance purpose has become an issue.

SUMMARY OF THE INVENTION

The present invention relates to a slide rail assembly capable of facilitating maintenance thereof.

According to an embodiment of the present invention, a slide rail assembly includes a first rail, a second rail and a third rail. The first rail has a front portion and a rear portion, and the first rail includes a first blocking structure. The second rail has a front portion and a rear portion. The third rail is mounted between the first rail and the second rail. When the third rail is located at a retracted position relative to the first rail, the first blocking structure is configured to prevent the third rail from being moved from the retracted position in a retracted direction. When the third rail is located at the retracted position, the second rail is able to be moved relative to the third rail in the retracted direction to a predetermined position with the rear portion of the second rail being beyond the rear portion of the first rail by a distance.

Preferably, the first rail further comprises a second blocking structure, and the slide rail assembly further includes a working member arranged to the third rail in a movable manner. During a process where the second rail is moved in the retracted direction, the second rail is capable of switching the working member from a first state to a second state, such that the working member in the second state cooperates with the second blocking structure for preventing the third rail from being moved from the retracted position in an extended direction.

Preferably, the working member is pivoted to the third rail.

Preferably, the slide rail assembly further includes a resilient member configured to provide a resilient force to the working member, so as to hold the working member in the first state.

Preferably, the third rail has an open hole toward the first rail, and the working member includes an extending portion passing through the open hole. When the second rail is moved in the retracted direction to switch the working member from the first state to the second state, the working member is held in the second state through the extending portion in cooperation with the second blocking structure.

Preferably, the second rail includes a first wall, a second wall and a side wall connected between the first wall and the second wall, and the working member is driven to switch to the second state through one of the first wall and the second wall of the second rail.

Preferably, the working member further includes a supporting portion, and the working member is capable of being held in the second state through the supporting portion abutting against one of the first wall and the second wall of the second rail.

Preferably, the slide rail assembly further includes a front bracket and a rear bracket, and the front bracket and the rear bracket are disposed adjacent to the front portion and the rear portion of the first rail respectively.

Preferably, the slide rail assembly further includes an auxiliary member arranged between the front portion and the rear portion of the first rail, and the auxiliary member includes a guiding portion and a blocking portion. When the working member is in the first state, the working member does not cooperate with the second blocking structure allowing the third rail to be moved relative to the first rail in the extended direction. The working member is guided to the blocking portion by the guiding portion during a predetermined movement where the working member is moved, so as to prevent the third rail from being moved relative to the first rail in the retracted direction when the third rail is at a first extension position.

Preferably, a blocking member is disposed on the third rail and adjacent to a front portion of the third rail, and the slide rail assembly further includes a moving member and a resilient base. The moving member is pivoted to the second rail. The resilient base provides a resilient force to the moving member, so as to hold the moving member in a predetermined state. When the third rail is at the first extension position, the moving member in the predetermined state is able to abut against the blocking member during a process where the second rail is moved relative to the third rail in the extended direction, leading the second rail to be at a second extension position relative to the third rail.

Preferably, the slide rail assembly further includes an operating member configured to operate the moving member. When the second rail is at the second extension position, the operating member is operated to drive the moving member to be no longer in the predetermined state, allowing the second rail to be detached from the third rail in the extended direction.

According to another embodiment of the present invention, a slide rail assembly includes a first rail, a second rail, a third rail and a working member. The first rail includes a first blocking structure and a second blocking structure. The third rail is movable relative to the first rail. The second rail is movable relative to the third rail. The working member is arranged to the third rail in a movable manner. When the third rail is at a retracted position relative to the first rail, the first blocking structure is configured to prevent the third rail from being moved from the retracted position in a retracted direction. When the second rail is moved in the retracted direction from a closing position, the second rail is capable of switching the working member from a first state to a second state, such that the working member in the second state cooperates with the second blocking structure for preventing the third rail from being moved from the retracted position in an extended direction opposite to the retracted direction.

According to another embodiment of the present invention, a slide rail assembly, configured to be mounted to a rack, includes a first rail, a second rail and a third rail. The first rail has a front portion and a rear portion. The front portion and the rear portion are mounted to a first post and a second post of the rack through a front bracket and a rear bracket respectively. The first rail includes a first blocking structure. The second rail has a front portion and a rear portion. The third rail is mounted between the first rail and the second rail. When the third rail is at a retracted position relative to the first rail, the first blocking structure is configured to prevent the third rail from being moved in a retracted direction from the retracted position. When the third rail is at the retracted position, the second rail is able to be moved relative to the third rail in the retracted direction from a closing position to a predetermined position with the rear portion of the second rail being beyond the rear portion of the first rail by a distance.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 4 is a diagram of the slide rail assembly implemented in the rack and in a retracted state according to the embodiment of the present invention.

FIG. 5 is an enlarged diagram of region A shown in FIG. 4.

FIG. 6 is a diagram of the slide rail assembly implemented in the rack where a second rail of the slide rail assembly is moved relative to a first rail or a third rail in a retracted direction from a closing position according to the embodiment of the present invention.

FIG. 7 is an enlarged diagram of region A shown in FIG. 6.

FIG. 9 is a diagram of the slide rail assembly implemented in the rack where the second rail and the third rail of the slide rail assembly are moved relative to the first rail in an extended direction according to the embodiment of the present invention.

FIG. 10 is an enlarged diagram of region A shown in FIG. 9.

FIG. 11 is a diagram of the slide rail assembly implemented in the rack where the second rail of the slide rail assembly is moved in the extended direction until a moving member abuts against a blocking member according to the embodiment of the present invention.

FIG. 12 is an enlarged diagram of region A shown in FIG. 11.

FIG. 13 is a diagram of the slide rail assembly implemented in the rack and a moving member is operated to be no longer abutting against the blocking member according to the embodiment of the present invention.

FIG. 14 is an enlarged diagram of region A shown in FIG. 13.

DETAILED DESCRIPTION

Figure 1:
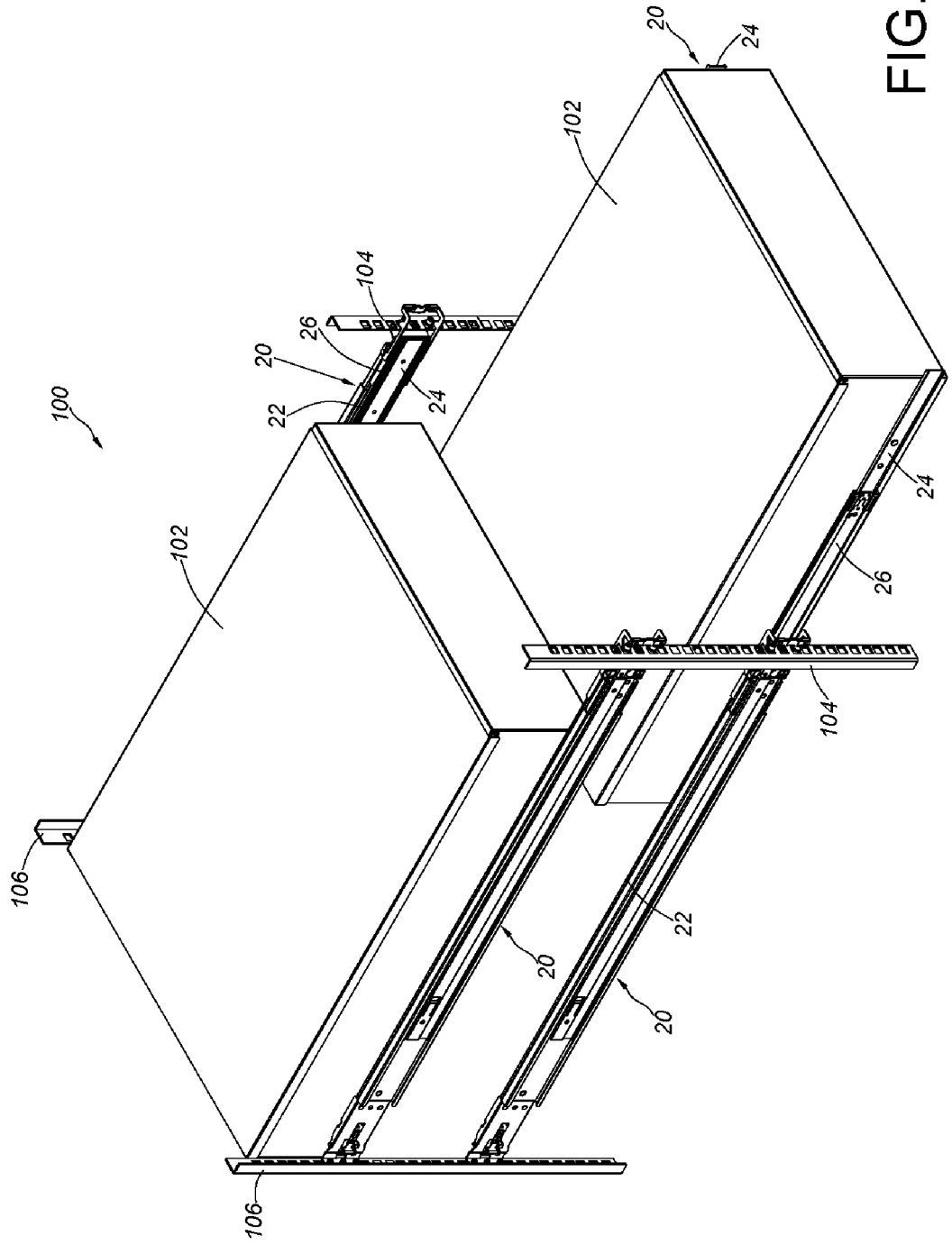
FIG. 1 is a schematic diagram of a rack system according to an embodiment of the present invention, wherein a carried object arranged in a lower level of a rack is moved out toward a front side of the rack.

As shown in FIG. 1, in a rack system 100, a carried object 102 is configured as a drawer to be equipped with slide rail assemblies 20 on two opposite sides thereof, such that the carried object 102 is mounted to a rack, wherein the aforesaid rack includes a plurality of posts for each of the slide rail assemblies 20 to be mounted thereon. In practical application, the slide rail assembly 20 includes a first rail 22 and a second rail 24 movable relative to the first rail 22. Preferably, the slide rail assembly 20 further includes a third rail 26 mounted between the first rail 22 and the second rail 24, and the third rail 26 is configured to elongate displacement of the second rail 24 relative to the first rail 22.

Herein, two portions (e.g., a front portion and a rear portion) of the first rail 22 are mounted to a first post 104 and a second post 106 of the rack system 100. Further, the second rail 24 can be located at a closing position relative to the first rail 22, which allows the carried object 102 (as shown in FIG. 1, the carried object 102 arranged in an upper level of the rack) to be contained in the rack. Alternatively, the second rail 24 can be located at an extension position relative to the first rail 22 or the third rail 26, which allows the carried object 102 (as shown in FIG. 1, the carried object 102 arranged in a lower level of the rack) to be moved out from inside the rack.

Figure 2:
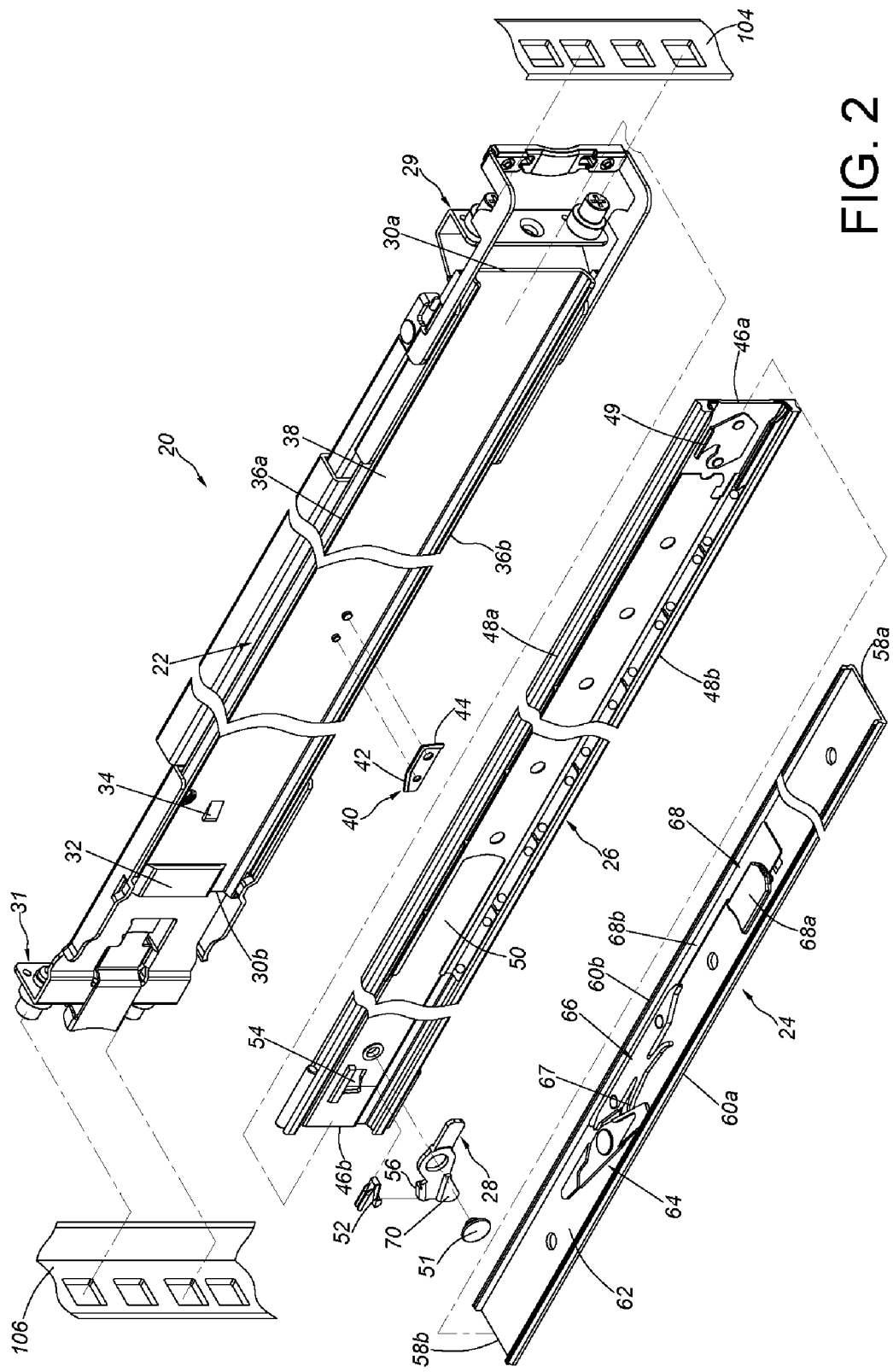
FIG. 2 is an exploded diagram of a slide rail assembly implemented in the rack according to the embodiment of the present invention.
Figure 3:
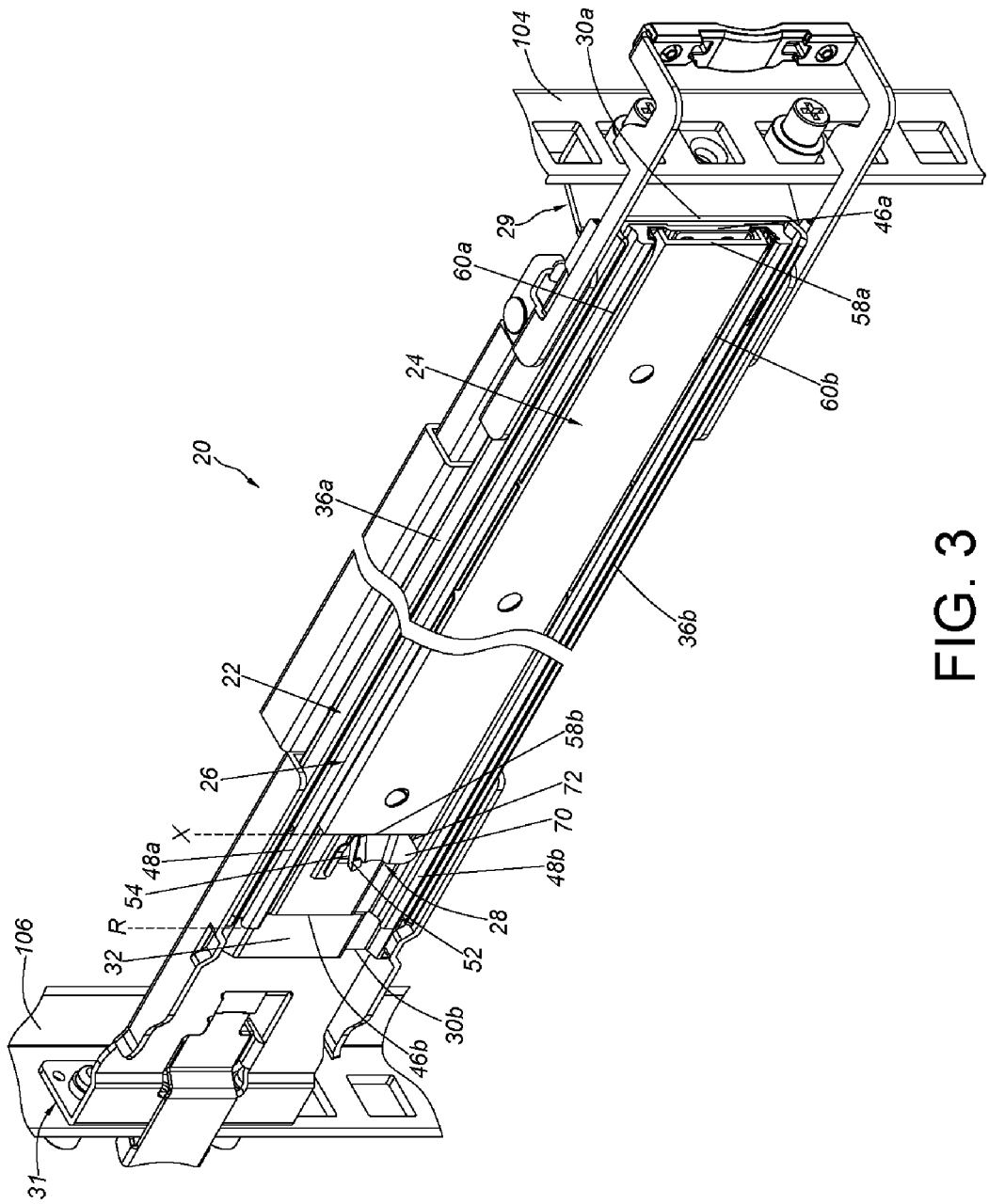
FIG. 3 is an assembly diagram of the slide rail assembly implemented in the rack according to the embodiment of the present invention.

As shown in FIG. 2 and FIG. 3, except for the first rail 22, the second rail 24 and the third rail 26, the slide rail assembly 20 according to the embodiment of the present invention preferably includes a working member 28.

The first rail 22 has a front portion 30a and a rear portion 30b. Preferably, the slide rail assembly 20 further includes a front bracket 29 and a rear bracket 31 disposed adjacent to the front portion 30a and the rear portion 30b of the first rail 22, respectively. The front bracket 29 and the rear bracket 31 are configured to mount the slide rail assembly 20 to the first post 104 and the second post 106. The front bracket 29 and the rear bracket 31 are known to those of ordinary skills in the art, and related descriptions are omitted herein for simplicity. The first rail 22 includes a first blocking structure 32 and a second blocking structure 34. In practical application, the first rail 22 further includes a first wall 36a, a second wall 36b and a side wall 38 connected between the first wall 36a and the second wall 36b of the first rail 22. The first wall 36a, the second wall 36b and the side wall 38 of the first rail 22 cooperatively define a first longitudinal passage. Preferably, the first blocking structure 32 and the second blocking structure 34 are located on the side wall 38 of the first rail 22, wherein the first blocking structure 32 is adjacent to rear portion 30b of the first rail 22; the second blocking structure 34 and the first blocking structure 32 are spaced by a longitudinal distance. The first blocking structure 32 and the second blocking structure 34 are illustrative of a protrusion or a protruding block, but the present invention is not limited thereto. Preferably, the slide rail assembly 20 further includes an auxiliary member 40 arranged between the front portion 30a and the rear portion 30b of the first rail 22 and disposed on the side wall 38 of the first rail 22. The auxiliary member 40 includes a guiding portion 42 and a blocking portion 44 adjacent to the guiding portion 42. Preferably, the auxiliary member 40 is fixed on the first rail 22.

The third rail 26 is movably mounted between the first rail 22 and the second rail 24. In detail, the third rail 26 is mounted to the first longitudinal passage of the first rail 22 and movable relative to the first rail 22. The third rail 26 has a front portion 46a and a rear portion 46b. The third rail 26 includes a first wall 48a, a second wall 48b and a side wall 50 connected between the first wall 48a and the second wall 48b of the third rail 26. The first wall 48a, the second wall 48b and the side wall 50 of the third rail 26 cooperatively define a second longitudinal passage. Preferably, a blocking member 49 is disposed on the third rail 26 and adjacent to the front portion 46a of the third rail 26. The blocking member 49 is, for example, a protruded portion or a protruded block. Preferably, the blocking member 49 is fixed to the side wall 50 of the third rail 26.

The wording member 28 is arranged to the third rail 26 in a movable manner. Specifically, the working member 28 is pivoted to the side wall 50 of the third rail 26 through a shaft member 51, and the working member 28 is adjacent to the rear portion 46b of the third rail 26. Preferably, the slide rail assembly 20 further includes a resilient member 52 configured to provide a resilient force to the working member 28 so as to hold the working member 28 in a first state. Preferably, the third rail 26 has an open hole 54 toward the side wall 38 of the first rail 22. Preferably, the working member 28 includes an extending portion 56 passing through the open hole 54.

The second rail 24 is mounted to the second longitudinal passage of the third rail 26 and movable relative to the third rail 26. Wherein, the second rail 24 is usually configured to carry the carried object 102, which can be referred to the carried object 102 illustrated in FIG. 15. The carried object is, for example, an electronic apparatus, but the present invention is not limited thereto. The second rail 24 has a front portion 58a and a rear portion 58b. The second rail 24 includes a first wall 60a, a second wall 60b and a side wall 62 connected between the first wall 60a and the second wall 60b of the second rail 24. Preferably, the slide rail assembly 20 further includes a moving member 64, a resilient base 66 and an operating member 68. The moving member is pivoted to the side wall 62 of the second rail 24. The resilient base 66 has a resilient force portion 67 providing a resilient force to the moving member 64 so as to hold the moving member 64 in a predetermined state. The operating member 68 is configured to operate the moving member 64 to move. Preferably, the operating member 68 has an operating portion 68a and an extending section 68b extended from the operating portion 68 by a predetermined length. The extending section 68b is substantially disposed along a longitudinal direction of the second rail 24.

As shown in FIG. 4, the slide rail assembly 20 is mounted to the first post 104 and the second post 106 through the front bracket 29 and the rear bracket 31. At this time, the slide rail assembly 20 is in a retracted state. When the third rail 26 is located at a retracted position R relative to the first rail 22, the first blocking structure 32 is configured to prevent the third rail 26 from being moved from the retracted position R in a retracted direction D1. Specifically, when the third rail 26 is located at the retracted position R, the first blocking structure 32 is able to abut against a portion of the third rail 26 (for example, the rear portion 46b), so as to prevent the third rail 26 located at the retracted position R from being moved relative to the first rail 22 in the retracted direction D1. Wherein, the working member 28 can be held in the first state S1 by the resilient force of the resilient 52, which can be referred to FIG. 5. Wherein, when the third rail 26 is located at the retracted position R and the working member 28 is in the first state S1, the second blocking structure 34 of the first rail 22 does not abut against the extending portion 56 of the working member 28 so as to make the third rail 26 movable toward an opening direction, which is a direction opposite to the retracted direction D1, at the retracted position. On the other hand, when the third rail 26 is located at the retracted position R and the working member 28 is in the first state S1, the second rail 24 is located at a closed position X, and the second wall 60b is corresponding to or toward a supporting portion 70 of the working member 28. Preferably, the supporting portion 70 has a guiding section 72. When the third rail 26 is located at the retracted position R and the working member is in the first state S1, the second wall 60b of the rear portion 58b of the second rail 24 is corresponding to or toward the guiding section 72 of the supporting portion 70 of the working member 28. Wherein, the guiding section 72 is, for example, an incline surface or an arc surface.

As shown in FIGS. 4 to 6, when the third rail 26 is located at the retracted position R relative to the first rail 22, the second rail 24 is movable from the closed position X relative to the third rail 26 in the retracted direction D1. Further, during the process where the second rail 24 is moved in the retracted direction D1, the second rail 24 contacts the guiding section 72 of the supporting portion 70 through the second wall 60b of the rear portion 58b (as shown in FIG. 5) so as to drive the working member 28 to deflect from the first state S1 to change to a second state S2, which can be referred to FIG. 7, so as to make the working member 28 in the second state S2 in cooperation with the second blocking structure 34 to prevent the third rail 26 from being moved from the retracted position R toward the opening direction, which is a direction opposite to the retracted direction D1.

Specifically, when the second rail 24 is moved in the retracted direction D1 and drives the working member 28 to change to the second state S2, the working member in the second state S2 cooperates with the second blocking structure 34 through the extending portion 56. For example, when the working member 28 is in the second state S2, the second blocking structure 34 of the first rail 22 is able to block the extending portion 56 of the working member 28 so as to prevent the third rail 26 located at the retracted position R from being moved in the opening direction. Wherein, when the working member 28 is in the second state S2, the resilient member 52 is in a state where the resilient force is accumulated. Preferably, the working member 28 can be held in the second state S2 through the supporting portion 70 abutting against the second wall 60b of the second rail 24.

Figure 8:
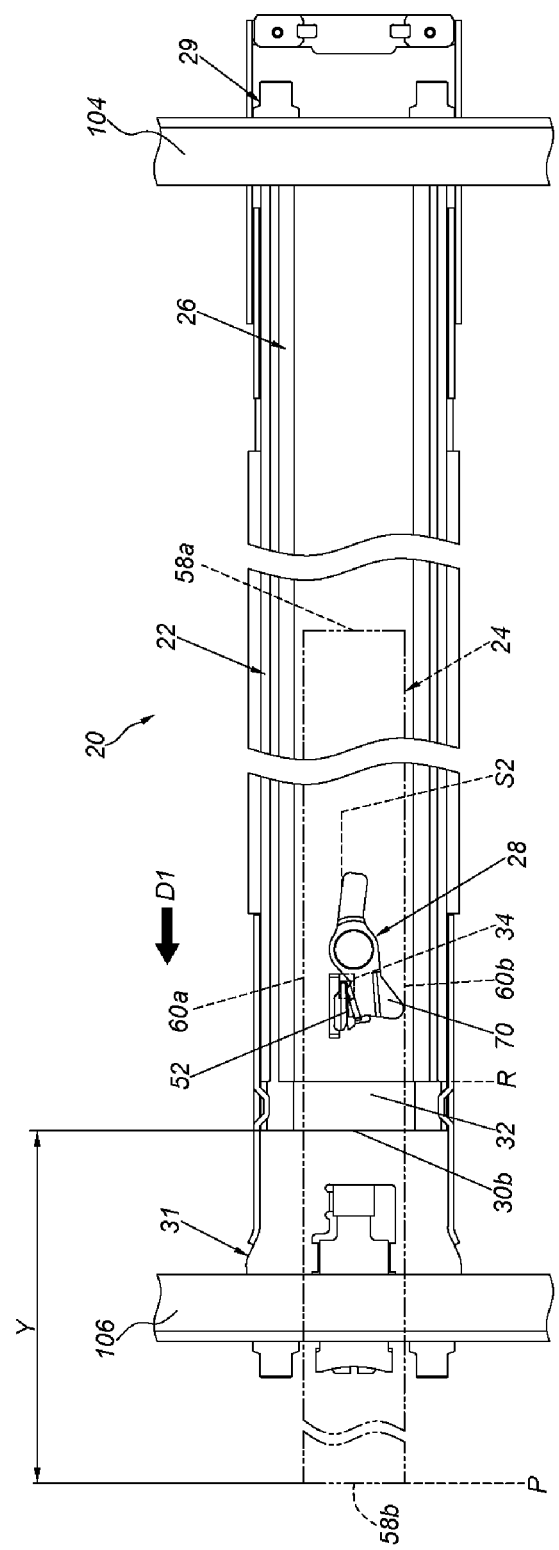
FIG. 8 is a diagram of the slide rail assembly implemented in the rack where the second rail of the slide rail assembly is moved in the retracted direction to a predetermined position according to the embodiment of the present invention.

As shown in FIG. 8, when the third rail 26 is located at the retracted position R relative to the first rail 22 and the second rail 24 is further moved relative to the third rail 26 in the retracted direction D1 to a predetermined position P (or an over-closed position), the rear portion 58b of the second rail 24 is beyond the rear portion 30b of the first rail 22 (or the second post 106) by a distance.

As shown in FIGS. 8 to 10, when the second rail 24 is moved relative to the third rail 26 in the opening direction D2, which is a direction opposite to the retracted direction D1, until the second rail 24 is moved in the opening direction D2 to a predetermined step, the supporting portion 70 of the working member 28 no longer abuts against the second wall 60b of the second rail 24 so as to make the working member 28 release the resilient force in response to the resilient member 52 from the second state S2 to recover to the first state S1.

Further, when the working member 28 is in the first state S1, the working member 28 does not cooperate with the second blocking structure 34 (in other words, the second blocking structure 34 does not block extending portion 56 of the working member 28) so as to make the third rail 26 movable relative to the first rail 22 from the retracted position R in the opening direction D2. Until the third rail 26 is moved to a predetermined step, the extending portion 56 of the working member 28 is guided to the blocking portion 44 by the guiding portion 42 of the auxiliary member 40 to prevent the third rail 26 located at a first extension position E1 from being moved relative to the first rail 22 in the retracted direction D1. Specifically, when the third rail 26 is located at the first extension position E1, the extending portion 56 of the working member 28 can be blocked by the blocking portion 44 of the auxiliary member 40 so as to prevent the third rail 26 located at the first extension position E1 being moved relative to the first rail 22 in the retracted direction D1.

As shown in FIGS. 11 and 12, when the third rail 26 is located at the first extension position E1 and the second rail 24 is moved relative to the third rail 26 in the opening direction D2, due to the fact that the moving member 64 is in the predetermined state in response to the resilient force of the resilient force portion 67 of the resilient base 66, the moving member 64 abuts against the blocking member 49 and make the second rail 24 located at a second extension position E2 relative to the third rail 26.

As shown in FIGS. 12 to 14, when the second rail 24 is located at the second extension position E2, the user can operate the moving member 64 to deflect by an angle and no longer in the predetermined state through the operating member 68. In other words, the moving member 64 no longer abuts against the blocking member 49 to make the second rail 24 detachable relative to the third rail 26 in the opening direction D2. Hereby, the extending section 68b of the operating member 68 has a driving portion 68c capable of driving the moving member 64 to deflect the angle is illustrated as an example (since this part is known to a person having ordinary skill in the art, it is omitted hereby for simplicity). According to the disposition, when the second rail 24 carries the carried object, which can be referred to the carried object 102 illustrated in FIG. 15, the carried object and the second rail 24 can be detached from the third rail 26.

Figure 15:
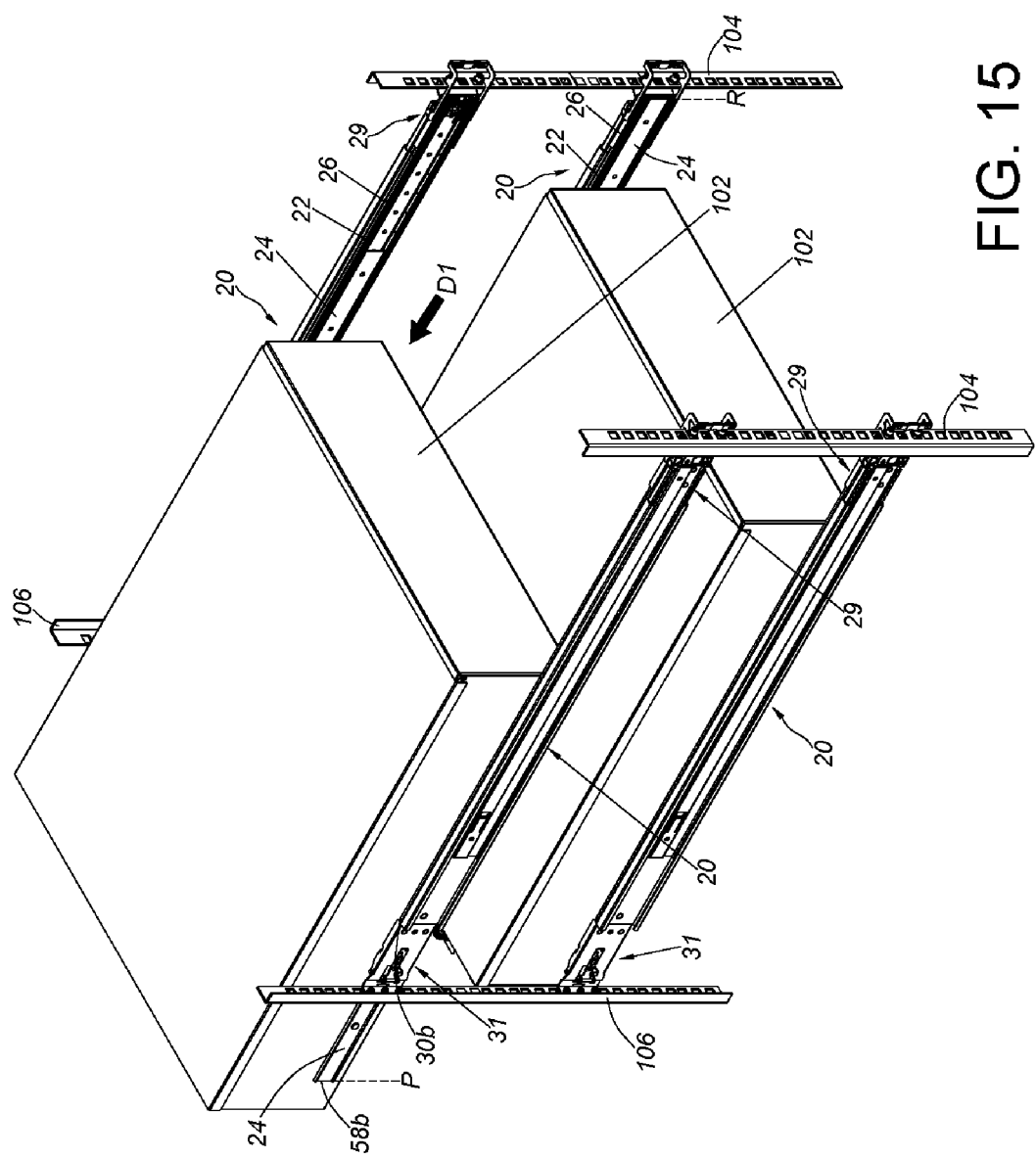
FIG. 15 is a schematic diagram of the rack system according to an embodiment of the present invention, wherein a carried object arranged in an upper level of the rack is moved out toward a rear side of the rack.

As shown in FIG. 15, in a rack system, a plurality of the carried object 102, which can be referred to the carried object 102 located at the lower layer in FIG. 15, can be mounted to the first post 104 and the second post 106 of the rack through a pair of the slide rail assembly 20. Wherein, since each structural disposition of the slide rail assembly 20 is disclosed above, it is omitted hereby for simplicity.

Further, according to the structural disposition of the slide rail assembly 20 above, when the third rail 26 is located at a retracted position R relative to the first rail 22, the second rail 24 which carries the carried object, which can be referred to the carried object 102 located at the upper layer in FIG. 15, is movable relative to the third rail 26 in the retracted direction D1 to the predetermined position P, which can be referred to FIG. 8, and the rear portion 58b of the second rail 24 is beyond the rear portion 30b of the first rail 22 (or the second post 106) by a distance. According to the disposition, it is capable of facilitating maintenance of the second rail 24 or the carried object 102.

Therefore, the slide rail assembly of the present invention is characterized in that:

1. when the third rail 26 is located at the retracted position R relative to the first rail 22 and the second rail 24 is moved relative to the third rail 26 from the closed position X in the retracted direction D1 to the predetermined position P (or the over-closed position), the rear portion 58b of the second rail 24 is beyond the rear portion 30b of the first rail 22 (or the second post 106) by a distance. According to the disposition, it is capable of facilitating maintenance of the second rail 24 or the carried object 102.

2. When the third rail 26 is located at the retracted position R relative to the first rail 22, due to the fact that the first blocking structure 32 blocks the third rail 26, it is possible to prevent the third rail 26 from being moved in the retracted direction D1. Besides, due to the fact that the second blocking structure 34 blocks the working member 28 in the second state S2, it is possible to prevent the third rail 26 from being moved in the opening direction D2.

3. When the third rail 26 is located at the retracted position R and the working member 28 is in the first state S1, the second rail 24 in the closed position X is able to be moved in the retracted direction D1 and drive the working member 28 from the first state S1 to change to the second state S2 through the second wall 60b of the rear portion 58b contacting the supporting portion 70.

4. The working member 28 is able to be held in the second state S2 through the supporting portion 70 abutting against the second wall 60b of the second rail 24.

5. The second rail 24 is able to be located at the closed position X relative to the first rail 22 or the third rail 26, to be moved from the closed position X in the retracted direction D1 to the predetermined position P (or the over-closed position), or to be moved from the closed position X in the opening direction D2 to the extension position E2. Wherein, when the second rail 24 is located at the predetermined position P, it is beneficial for maintenances of the second rail 24 or the carried object 102.

6. The second rail 24 is detachable relative to the third rail 26 in the opening direction D2. According to the disposition, when the second rail 24 carries the carried object 102, the carried object 102 and the second rail 24 are unloadable from the third rail 26. Hence, it is helpful for maintenances of the second rail 24 or the carried object 102.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail assembly, comprising:
   a first rail having a front portion and a rear portion, the first rail comprising a first blocking structure and a second blocking structure;
   a second rail having a front portion and a rear portion;
   a third rail mounted between the first rail and the second rail;
   a working member arranged to the third rail in a movable manner; and
   an auxiliary member arranged between the front portion and the rear portion of the first rail, the auxiliary member comprising a guiding portion and a blocking portion;

wherein when the third rail is located at a retracted position relative to the first rail, the first blocking structure is configured to prevent the third rail from being moved from the retracted position in a retracted direction;

wherein when the third rail is located at the retracted position, the second rail is able to be moved relative to the third rail in the retracted direction to a predetermined position with the rear portion of the second rail being beyond the rear portion of the first rail by a distance;

wherein during a process where the second rail is moved in the retracted direction, the second rail is capable of switching the working member from a first state to a second state, such that the working member in the second state cooperates with the second blocking structure for preventing the third rail from being moved from the retracted position in an extended direction opposite to the retracted direction;

where when the working member is in the first state, the working member does not cooperate with the second blocking structure allowing the third rail to be moved relative to the first rail in the extended direction, the working member being guided to the blocking portion by the guiding portion during a predetermined movement where the working member is moved, so as to prevent the third rail from being moved relative to the first rail in the retracted direction when the third rail is at a first extension position.

2. The slide rail assembly of claim 1, wherein the working member is pivoted to the third rail.

3. The slide rail assembly of claim 2, further comprising a resilient member configured to provide a resilient force to the working member, so as to hold the working member in the first state.

4. The slide rail assembly of claim 3, wherein the third rail has an open hole toward the first rail, the working member comprises an extending portion passing through the open hole, and when the second rail is moved in the retracted direction to switch the working member from the first state to the second state, the working member is held in the second state through the extending portion in cooperation with the second blocking structure.

5. The slide rail assembly of claim 4, wherein the second rail comprises a first wall, a second wall and a side wall connected between the first wall and the second wall, and the working member is driven to switch to the second state through one of the first wall and the second wall of the second rail.

6. The slide rail assembly of claim 5, wherein the working member further comprises a supporting portion, and the working member is capable of being held in the second state through the supporting portion abutting against one of the first wall and the second wall of the second rail.

7. The slide rail assembly of claim 1, further comprising a front bracket and a rear bracket, and the front bracket and the rear bracket are disposed adjacent to the front portion and the rear portion of the first rail respectively.

8. The slide rail assembly of claim 1, wherein a blocking member is disposed on the third rail and adjacent to a front portion of the third rail, the slide rail assembly further comprises a moving member and a resilient base, the moving member is pivoted to the second rail, the resilient base provides a resilient force to the moving member, so as to hold the moving member in a predetermined state, and when the third rail is at the first extension position, the moving member in the predetermined state is able to abut against the blocking member during a process where the second rail is moved relative to the third rail in the extended direction, leading the second rail to be at a second extension position relative to the third rail.

9. The slide rail assembly of claim 8, further comprising an operating member configured to operate the moving member, when the second rail is at the second extension position, the operating member being operated to drive the moving member to be no longer in the predetermined state, allowing the second rail to be detached from the third rail in the extended direction.

10. A slide rail assembly, comprising:
a first rail having a front portion and a rear portion, the first rail comprising a first blocking structure and a second blocking structure;
a third rail movable relative to the first rail;
a second rail movable relative to the third rail;
a working member arranged to the third rail in a movable manner; and
an auxiliary member arranged between the front portion and the rear portion of the first rail, the auxiliary member comprising a guiding portion and a blocking portion;
wherein the first blocking structure is configured to prevent the third rail from being moved from the retracted position in a retracted direction when the third rail is at a retracted position relative to the first rail;
wherein the second rail is capable of switching the working member from a first state to a second state during a process where the second rail is moved in the retracted direction from a closing position, such that the working member in the second state cooperates with the second blocking structure for preventing the third rail from being moved from the retracted position in an extended direction opposite to the retracted direction;
where when the working member is in the first state, the working member does not cooperate with the second blocking structure allowing the third rail to be moved relative to the first rail in the extended direction, the working member being guided to the blocking portion by the guiding portion during a predetermined movement where the working member is moved, so as to prevent the third rail from being moved relative to the first rail in the retracted direction when the third rail is at a first extension position.

11. The slide rail assembly of claim 10, wherein the working member is pivoted to the third rail.

12. The slide rail assembly of claim 11, further comprising a resilient member configured to provide a resilient force to the working member, so as to hold the working member in the first state.

13. The slide rail assembly of claim 12, wherein the third rail has an open hole toward the first rail, the working member comprises an extending portion passing through the open hole, and the second rail, being moved in the retracted direction from the closing position, switches the working member from the first state to the second state, the working member in the second state enables the extending portion to cooperate with the second blocking structure.

14. The slide rail assembly of claim 13, wherein the second rail comprises a first wall, a second wall and a side wall connected between the first wall and the second wall, and the second rail drives the working member to switch from the first state to the second state through one of the first wall and the second wall.

15. The slide rail assembly of claim 14, wherein the working member further comprises a supporting portion, and the working member is capable of being held in the second state through the supporting portion abutting against one of the first wall and the second wall of the second rail.

16. The slide rail assembly of claim 10, further comprising a front bracket and a rear bracket, and the front bracket and the rear bracket are disposed adjacent to the front portion and the rear portion of the first rail respectively.

17. A slide rail assembly, configured to be mounted to a rack, comprising:
- a first rail having a front portion and a rear portion, the front portion and the rear portion being mounted to a first post and a second post of the rack through a front bracket and a rear bracket respectively, the first rail comprising a first blocking structure and a second blocking structure;
- a second rail having a front portion and a rear portion;
- a third rail mounted between the first rail and the second rail;
- a working member arranged to the third rail in a movable manner; and
- an auxiliary member arranged between the front portion and the rear portion of the first rail, the auxiliary member comprising a guiding portion and a blocking portion;
- wherein the first blocking structure is configured to prevent the third rail from being moved in a retracted direction from the retracted position when the third rail is at a retracted position relative to the first rail;
- wherein when the third rail is at the retracted position, the second rail is able to be moved relative to the third rail in the retracted direction from a closing position to a predetermined position with the rear portion of the second rail being beyond the rear portion of the first rail by a distance;
- wherein during a process where the second rail is moved in the retracted direction, the second rail is capable of switching the working member from a first state to a second state, such that the working member in the second state cooperates with the second blocking structure for preventing the third rail from being moved from the retracted position in an extended direction opposite to the retracted direction;
- where when the working member is in the first state, the working member does not cooperate with the second blocking structure allowing the third rail to be moved relative to the first rail in the extended direction, the working member being guided to the blocking portion by the guiding portion during a predetermined movement where the working member is moved, so as to prevent the third rail from being moved relative to the first rail in the retracted direction when the third rail is at a first extension position.

18. The slide rail assembly of claim 17, wherein the working member is pivoted to the third rail, the slide rail assembly further comprises a resilient member configured to provide a resilient force to the working member.

* * * * *